United States Patent
Kostylev et al.

(10) Patent No.: US 7,280,390 B2
(45) Date of Patent: Oct. 9, 2007

(54) READING PHASE CHANGE MEMORIES WITHOUT TRIGGERING RESET CELL THRESHOLD DEVICES

(75) Inventors: Sergey A. Kostylev, Bloomfield Hills, MI (US); Tyler Arthur Lowrey, West Augusta, VA (US); Wolodymyr Czubatyj, Warren, MI (US); Ward D. Parkinson, Boise, ID (US)

(73) Assignee: Ovonyx, Inc., Rochester Hills, MI (US)

( * ) Notice: Subject to any disclaimer, the term of this patent is extended or adjusted under 35 U.S.C. 154(b) by 212 days.

(21) Appl. No.: 11/105,829

(22) Filed: Apr. 14, 2005

(65) Prior Publication Data
US 2006/0233019 A1    Oct. 19, 2006

(51) Int. Cl.
*G11C 11/00* (2006.01)
(52) U.S. Cl. ............... 365/163; 365/113; 365/148
(58) Field of Classification Search ................ 365/163, 365/148, 113
See application file for complete search history.

(56) References Cited

U.S. PATENT DOCUMENTS

| | | | | |
|---|---|---|---|---|
| 5,912,839 A | * | 6/1999 | Ovshinsky et al. | 365/185.03 |
| 6,768,665 B2 | * | 7/2004 | Parkinson et al. | 365/113 |
| 7,106,618 B2 | * | 9/2006 | Morimoto | 365/148 |
| 2006/0227592 A1 | * | 10/2006 | Parkinson et al. | 365/148 |

OTHER PUBLICATIONS

U.S. Appl. No. 11/093,877, filed Mar. 30, 2005, Tyler Lowrey et al., *Using A Bit Specific Reference Level To Read A Memory*.
U.S. Appl. No. 11/093,864, filed Mar. 30, 2005, Tyler Lowrey et al., *Using Higher Current to Read A Triggered Phase Change Memory*.
U.S. Appl. No. 11/093,878, filed Mar. 30, 2005, Ward D. Parkinson et al., *Reading Phase Change Memories*.
U.S. Appl. No. 11/093,709, filed Mar. 30, 2005, Ferdinando Bedeschi et al., *Detecting Switching Of Access Elements Of Phase Change Memory Cells*.

* cited by examiner

*Primary Examiner*—Son Dinh
*Assistant Examiner*—Hien N Nguyen
(74) *Attorney, Agent, or Firm*—Trop, Pruner & Hu, P.C.

(57) ABSTRACT

A phase change memory may be read so as to reduce the likelihood of a read disturb. A read disturb may occur, for example, when a reset device is raised to a voltage, which causes its threshold device to trigger. The triggering of the threshold device produces a displacement current which may convert a reset device to a set device. By ensuring that the reset cell never reaches a voltage that would result in triggering of the threshold device, read disturbs may be reduced.

30 Claims, 7 Drawing Sheets

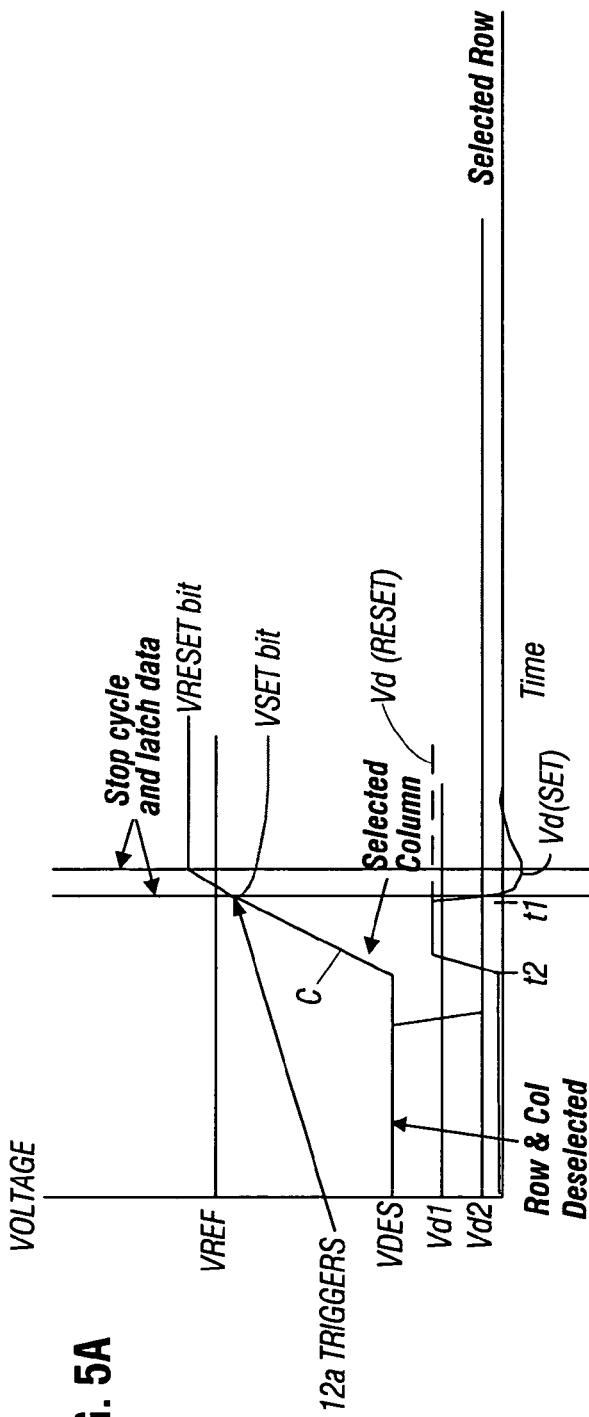
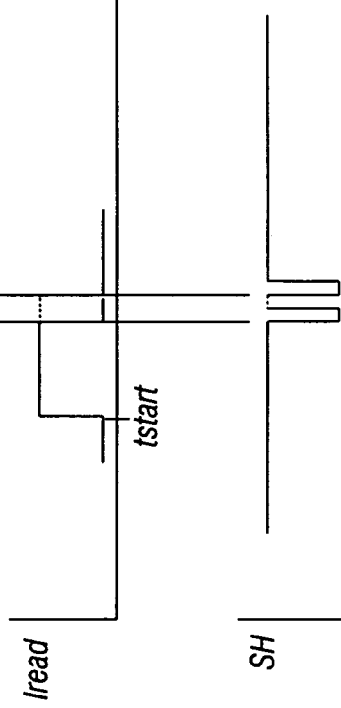
FIG. 5A
FIG. 5B
FIG. 5C

READING PHASE CHANGE MEMORIES WITHOUT TRIGGERING RESET CELL THRESHOLD DEVICES

BACKGROUND

This invention relates generally to semiconductor memories.

Phase change memory devices use phase change materials, i.e., materials that may be electrically switched between a generally amorphous and a generally crystalline state, as an electronic memory. One type of memory element utilizes a phase change material that may be, in one application, electrically switched between generally amorphous and generally crystalline local orders or between different detectable states of local order across the entire spectrum between completely amorphous and completely crystalline states.

Typical materials suitable for such an application include various chalcogenide elements. The state of the phase change materials is also non-volatile, absent application of excess temperatures, such as those in excess of 150° C. for extended times. When the memory is set in either a crystalline, semi-crystalline, amorphous, or semi-amorphous state representing a resistance value, that value is retained until reprogrammed, even if power is removed. This is because the programmed value represents a phase or physical state of the material (e.g., crystalline or amorphous).

The memory cells can be selected for a reading operation, for example, by applying suitable voltages to the respective word lines and suitable current pulses to the respective bit lines. A voltage reached at the bit line depends on the resistance of the storage element, i.e., the logic value stored in the selected memory cell.

The logic value stored in the memory cell is evaluated by using sense amplifiers to detect a difference in voltage and current reflecting the state of the memory. Typically, a sense amplifier includes a comparator receiving the bit line voltage, or a related voltage, and a suitable reference voltage for comparison to the level from the memory, after a period. For example, where the bit line voltage is higher than the reference voltage after a period of time, the memory state stored is described as a reset or logic value "0", whereas in the case in which the bit line voltage is lower than the reference voltage, the stored logic value is described as set or a "1".

An access element in each memory cell can be a threshold switch made of a phase-change material, similar to the memory element serially connected thereto. The access element switches (without changing its phase) from a high-resistance condition to a low-resistance condition when a voltage applied thereacross exceeds a threshold value and reverts to the high-resistance condition when a current flowing therethrough falls below a minimum holding value. A voltage across the access element in the low-resistance condition has a substantially constant value (holding voltage $V_H$) because the dynamic resistance dV/dI is relatively low so most of the voltage drop is a holding voltage, $V_H$. In this case, the matrix of memory cells can be advantageously provided without any transistor, and then using a single technological process.

To preserve cell state and avoid a "read disturb" state change during read or mis-read, the voltage across the memory storage area may be maintained at less than a maximum voltage, such as the threshold voltage of the memory element $V_{TH}$ (oum). To avoid exceeding this maximum allowed voltage, the current applied to the column may be less than desirable for rapid column charging, increasing read delay.

Thus, conventionally, the current to read phase change memories is limited to less than the threshold current of the memory element, $I_{TH}$ (oum) or the voltage forced is limited to avoid applying a voltage across the memory element higher than its threshold voltage, $I_{TH}$ (oum). However these techniques may respectively increase undesirably the read access times and/or the possibility of exceeding a current that avoids programming a set bit (read disturb). One reason for this limitation of read current is to prevent triggering of the phase change memory element, which may require refreshing the bit to meet the expected data retention times. Such refreshing (re-write after read) is undesirable for increasing the read cycle time and reducing bit endurance related to write cycles.

If the current flowing through the selected memory cell exceeds a threshold current value $I_{TH}$ (oum), the memory element is heated when the voltage across the memory element snaps back from $V_{TH}$ to $V_H$ due to displacement current related to driving the column voltage. The displacement current can spuriously program the selected bit from reset to set (read disturb).

BRIEF DESCRIPTION OF THE DRAWINGS

FIG. 5A is a theoretical depiction of voltage versus time for a selected column in accordance with another embodiment of the present invention without using actual data;

FIG. 5B is a theoretical depiction of the read current timing for the embodiment of FIG. 4A;

FIG. 5C is a theoretical depiction of the SH latch data signal versus time;

DETAILED DESCRIPTION

Figure 1:
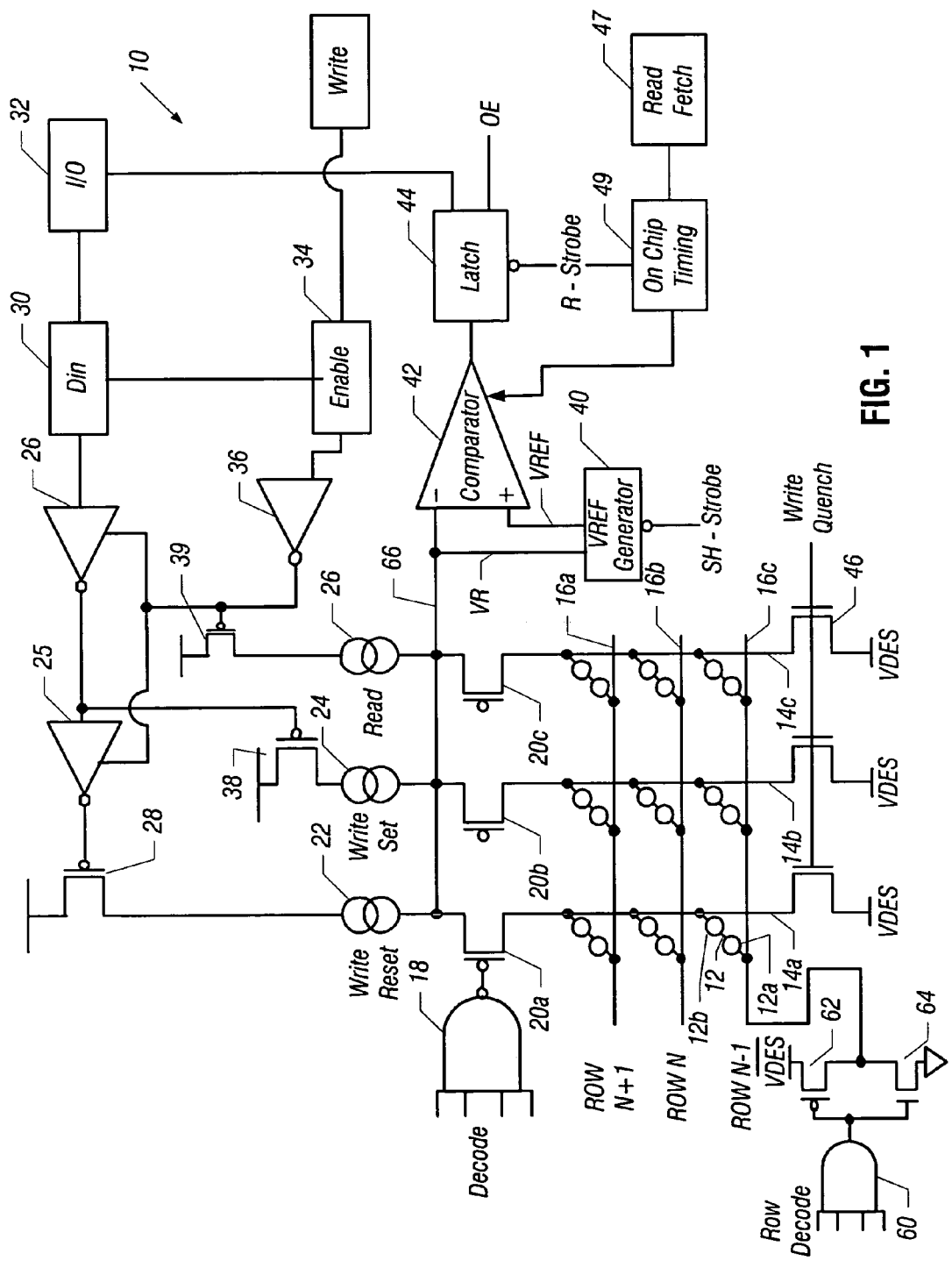
FIG. 1 is a circuit diagram for one embodiment of the present invention.

Referring to FIG. 1, a memory 10 may include an array of memory cells 12 arranged in rows 16 and columns 14 in accordance with one embodiment of the present invention. While a relatively small array is illustrated, the present invention is in no way limited to any particular size of an array. While the terms "rows" and "columns" are used herein, they are merely meant to be illustrative and are not limiting with respect to the type and style of the sensed array.

The memory 10 also includes a number of auxiliary lines, useful for the operation thereof. In particular, the memory is provided with a supply voltage line distributing a supply voltage through a chip including the memory, that, depending on the specific memory device embodiment, may be, typically, from 1 to 3 V, for example 1.8 V. A further supply voltage line (such as a ground voltage line GND) distributes the ground voltage or a negative voltage. A high voltage supply line provides a relatively high voltage, generated by devices (e.g. charge-pump voltage boosters not shown) integrated on the same chip, or externally supplied to the memory; for example 4.5-5 V that may, for example, be helpful during write.

The cell 12 may be a phase change memory cell. Examples of phase change memory cells include those using a chalcogenide memory element 12b (e.g., an ovonic unified memory or OUM) that stores a bit of data and a threshold device 12a that may be an ovonic threshold switch (OTS). The select or threshold device 12a may be an ovonic threshold switch that can be made of an alloy of chalcogenide that does not switch from an amorphous to a crystalline phase and which undergoes a rapid, electric field initiated change in conductivity, a change in conductivity that persists only so long as a holding current through the device is present.

In one embodiment, the phase change material used in the sensing memory device 12b may be suitable for non-volatile memory data storage. The phase change material may be a material having electrical properties (e.g., resistance) that may be changed through the application of energy such as, for example, heat, light, voltage potential, or electrical current.

Examples of phase change materials may include a chalcogenide material. A chalcogenide material may be a material that includes at least one element from column VI of the periodic table or may be a material that includes one or more of the chalcogen elements, e.g., any of the elements of tellurium, sulfur, or selenium. Chalcogenide materials may be non-volatile memory materials that may be used to store information that is retained even after the electrical power is removed.

In one embodiment, the phase change material may be chalcogenide element composition from the class of tellurium-germanium-antimony (Te$_x$Ge$_y$Sb$_z$) material or a GeSbTe alloy, such as 2,2,5, although the scope of the present invention is not limited to just these materials.

In one embodiment, if the memory material is a non-volatile, phase change material, the memory material may be programmed into one of at least two memory states by applying an electrical signal to the memory material. An electrical signal may alter the phase of the memory material between a substantially crystalline state and a substantially amorphous state, wherein the electrical resistance of the memory material in the substantially amorphous state is greater than the resistance of the memory material in the substantially crystalline state. Accordingly, in this embodiment, the memory material may be adapted to be altered to a particular one of a number of resistance values within a range of resistance values to provide digital or analog storage of information.

Programming of the memory material to alter the state or phase of the material may be accomplished by applying voltage potentials or forcing current into or out of the selected lines 14, 16, thereby generating a voltage potential across the memory material. An electrical current may flow through a portion of the memory material in response to the applied voltage potentials and current forced, and may result in heating of the memory material.

This controlled heating and subsequent controlled cooling may alter the memory state or phase of the memory material. A slow trailing edge of the write pulse on the column to row voltage difference assists in crystallizing a bit into the "set" state. Fast reduction in the column to row voltage difference across the memory cell after applying write current or voltage better assures amorphizing the bit into the "reset" state.

Altering the phase or state of the memory material may alter an electrical characteristic of the memory material. For example, resistance of the material may be altered by altering the phase of the memory material. Either all or a portion of the phase change memory material may be altered during the writing pulse (i.e. only a portion/region of sensing device 12b adjacent to either the top or bottom electrode may be phase changed during the write operation). In one embodiment, primarily the portion of memory material that undergoes phase change is the region that is adjacent to the smaller, more resistive lower electrode. The memory material may also be referred to as a programmable resistive material or simply a programmable resistance material.

In one embodiment, a voltage pulse may be applied across the memory material by applying a lower voltage to a lower line (e.g., a row 16) and forcing a current into the upper line (e.g., a column 14), so that a voltage develops across the memory element 12b after the select element 12a (in FIG. 1) is activated or triggered into a low impedance state. A current flowing through the memory material in response to the applied voltage potentials may result in heating of the memory material. This heating and subsequent cooling may alter the memory state or phase of the material.

In a "reset" state, the memory material may be in an amorphous or semi-amorphous state. In a "set" state, the memory material may be in a crystalline or semi-crystalline state. The resistance of the memory material in the amorphous or semi-amorphous state may be greater than the resistance of the material in the crystalline or semi-crystalline state. The association of reset and set with amorphous and crystalline states, respectively, is a convention. Other conventions may be adopted, such as referring to a reset bit as a logic "0" and a set bit as a logic "1."

Due to electrical current, the memory material may be heated to a relatively higher temperature and then subsequently cooled at a fast rate to amorphisize memory material and "reset" memory material, such as by using the quench transistors 46 in FIG. 1. Heating the volume or memory material to a relatively lower crystallization temperature may crystallize and "set" the memory material, using a lower current or a slow trailing edge.

Various resistances of memory material may be achieved to store information by varying the amount of current flow and duration through the volume of memory material, or by tailoring the edge rate of the trailing edge of the programming current or voltage difference pulse from column to row (that may impact the cooling quench rate of the selected memory element). For example, a slow trailing edge which may be more than 100 nsec will tend to assist setting a bit, whereas a trailing edge rate that may be less than 10 nsec fall time will tend to reset a bit.

The information stored in memory material may be read by measuring the resistance of the memory material. As an example, a read current may be provided to the memory material using opposed lines 14, 16 and a resulting read voltage across the memory material may be compared against a reference voltage using, for example, the sense amplifier 42.

The threshold device 12a has a holding voltage $V_H$ where the dynamic resistance decreases to dV/dI. The threshold device 12a has a threshold voltage $V_{TH}$, that, if exceeded, causes the voltage to snapback to approximately $V_H$. As current increases, the voltage increases with very little current flow until a threshold current $I_{TH}$ is exceeded at $V_{TH}$. From there, the voltage snaps back to about $V_H$ and then the voltage increases with increasing current along a dV/dI slope whose i-v characteristic voltage axis intercept is $V_H$.

The memory element 12b may be set, in which case it has a lower threshold voltage or 0V threshold voltage and lower resistance, or reset, in which case it has a higher threshold voltage and higher resistance. For a set bit, current increases with voltage until about $V_H$, where the dynamic resistance further decreases to dV/dI. The intercept of the i-v current voltage axis is $V_H$.

A reset memory element 12b increases far less with growing voltage across the element 12b than does a set bit until the voltage approaches $V_{TH}$. The current then may increase more rapidly with increasing voltage until $I_{TH}$ is exceeded at $V_{TH}$, and the device impedance decreases rapidly to dV/dI in series with its Vh. If the currently is increased thereafter, set and reset bits have about the same i-v characteristics.

As one non-limiting example, the memory element 12b may have a $V_H$ of 0.5 volts, a $V_{TH}$ of 1.1 volts and an $I_{TH}$ of about 10 microamps. As one non-limiting example, the threshold element 12a may have a $V_H$ of 1.0 volts, a $V_{TH}$ of 2.5 volts (and a snapback voltage $V_{snap}$ of 1.5 volts) and an $I_{TH}$ of about 10 microamps.

Figure 4:
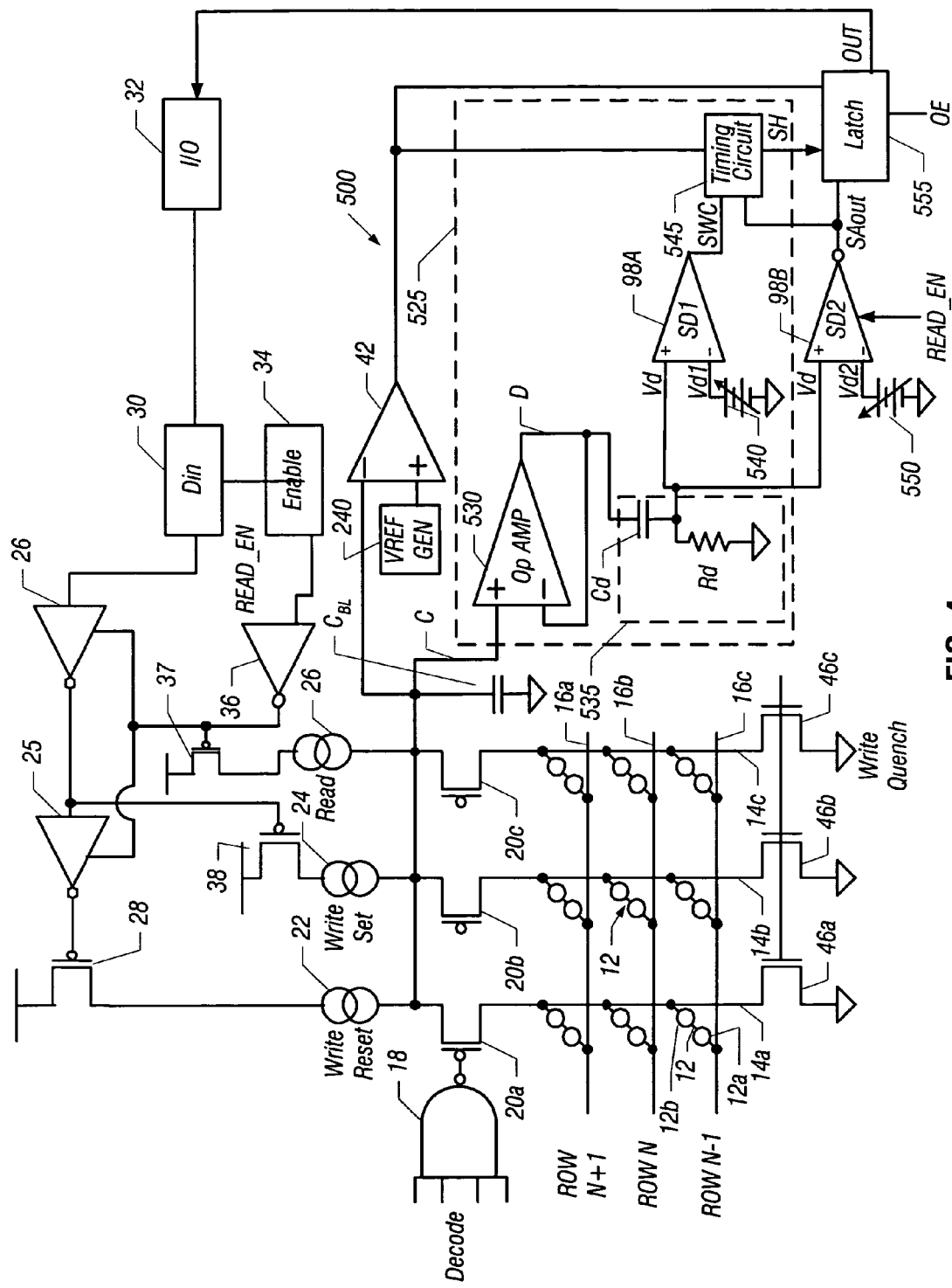
FIG. 4 is a circuit diagram for another embodiment of the present invention in which timing to stop the read cycle is generated by sensing a change in slope for charging the column line, thus detecting when the memory cell select element has triggered as the column charges to a more positive voltage.

A decoder 18 in FIGS. 1 and 4 receives address signals to select the desired column using transistors 20 uniquely associated with each column for cell selection. A reset write current source 22 is coupled to node 66 in parallel with a set write current source 24 and a read current source 26. The read current may be set to generate a fast rise time on the selected column (14a or 14b or 14c, with memory cell column selection determined by the "on" select transistors 20a or 20b or 20c). The current sources are coupled to selected columns 14 as needed in response to addressing commands from an external memory user such as a processor. A set of transistors 46a or 46b or 46c may be located on the bottom of the columns 14 in order to enable write quenching and deselect by assuring fast write current pulse trailing edge on columns 14. Fast quench is also assisted by simultaneous switching of the row from select (low) to a higher deselect voltage.

Transistors 28, 38, and 39 are on/off switches that select the desired current, generated by current source 22, 24 or 26, to the selected column 14 depending on whether the function desired respectively is to write a bit to its reset state, or write to the set state, or read the selected bit. A gate 36 either disables read by enabling write Din gates, or turns on transistor 36 to enable the read current source 26. Unless enabled for write, gates 25 and 26 turn off the write current sources, 22 and 24. The gate 36 is controlled by enable circuit 34. An input/output (I/O) control 32 is coupled to the data in (Din) circuit 30, which is coupled to select either write 0 or write 1 through selection of either current source 22 or 24, one having less write current to write a 1 (and crystallize) than the other that resets the selected bit to a 0 (amorphous). The Data-in circuit 30 is write enabled by 34 through gate 36.

Alternately, a single write current source may be used set at a current at or above the necessary reset current, with the resulting data written determined by tailoring the trailing edge to be slow (greater than 100 nsec) or fast (less than 10 nsec). For additional multibit storage, additional write current sources may be added with amplitude suitable for desired level (with only the lowest resistance state desired driven with a slow trailing edge)

A sense amplifier 42, in the form of a comparator in one embodiment, receives one input from a selected column, for example column 14c, being read. The sense amplifier 42 may optionally include a pre-charge circuit to pre-charge node 66 and the selected column of columns 14a, b or c to a pre-charged voltage. The sense amplifier 42 and reference voltage generator 40 may be provided on each column 14 in one embodiment, but may, as shown, be shared across an array of column lines to minimize related layout area. The on-chip timing 49 for the sense amplifier 42 and data output latch 44 may provide an output enable (OE) signal as an option which at least indicates when the output can be driven, though usually OE is also furnished by the processor to enable the output driver to a low impedance state (once the data is ready from the read cycle) to avoid bus conflict such as to and from the processor if Din is on the same pin as Dout.

The strobe into and output signal from the latch 44 is controlled by a read (R) strobe after the read fetch cycle is started by the equivalent of a read signal (e.g. Write going high), again usually furnished by a processor. Alternatively, fetch may be started on-chip by sensing an address change when write is not selected (by remaining high).

Figure 2:
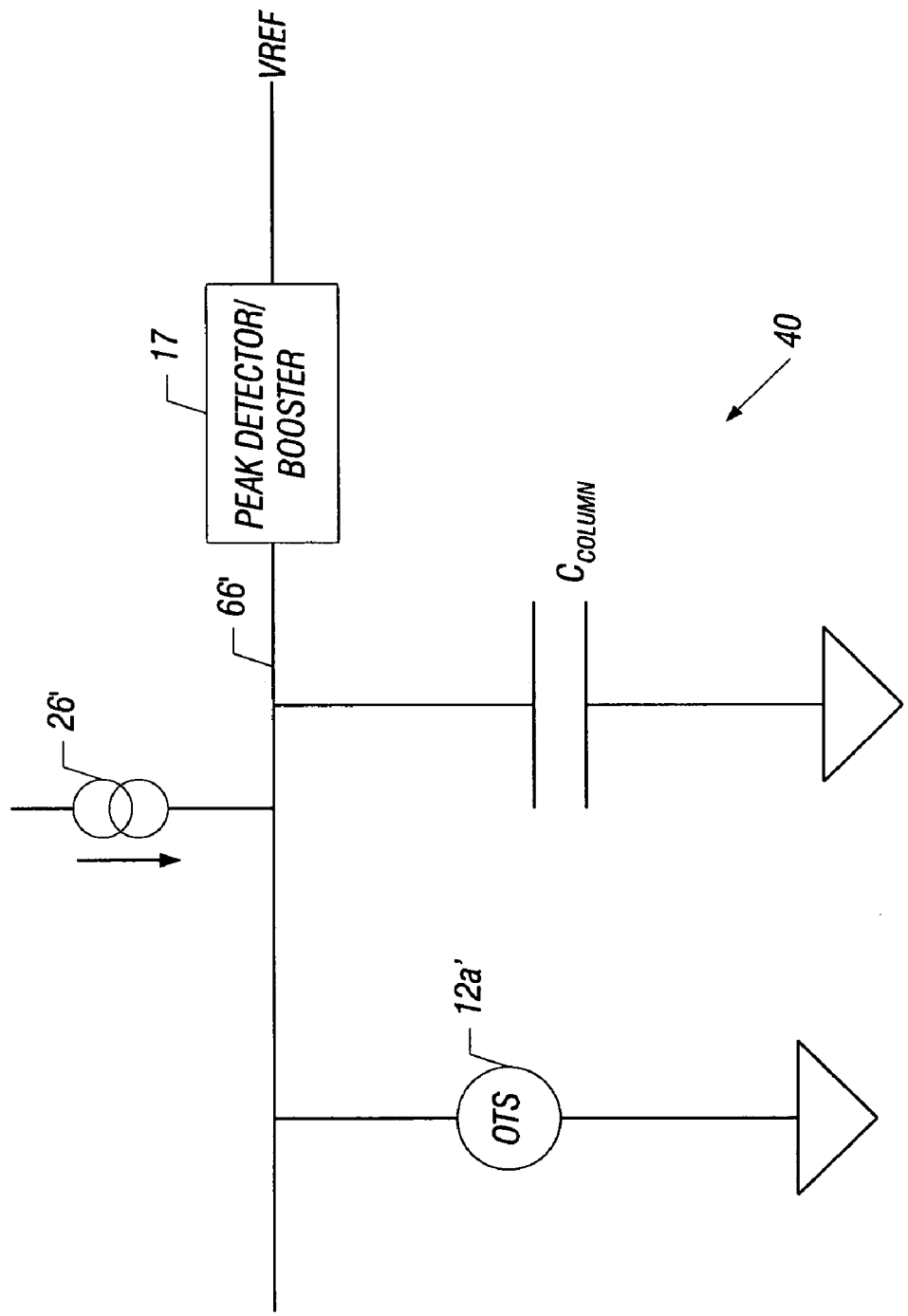
FIG. 2 is a reference circuit for one embodiment of the present invention.

The reference generator 40, shown in FIG. 2, produces a reference voltage VREF which may be higher than a column voltage driven by a set bit but lower in voltage than a column driven by a reset bit. The reference generator 40 may include a current source 26' coupled to a node 66'. Also coupled to the node 66' is a representative reference threshold device 12a' and the typical column 14 capacitance $C_{column}$.

The reference threshold device 12a' and its capacitance may be a cell on a reference column (not shown). The current source 26' may produce a current about equal to the read current produced by the current source 26. Then, the node 66' will increase with about the same timing as the selected column 14. The selected row voltage dropped in the memory array may be about the same as ground, so the reference circuit 40 may be hooked to ground. Alternatively, the circuit 40 may be driven by a circuit that better approximates the lower voltage of the selected cell, allowing for ground drops, row select drops, etc.

The circuit 40 produces a rising waveform on node 66' until the device 12a' triggers and snaps back to a lower voltage. The reference threshold device 12a' has a threshold voltage about the same as an array cell's threshold device 12. Thus, the device 12a' thresholds at about the same, or a short time before or after, as a threshold device 12a, when the sensed cell 12 is set. The peak of this voltage may be sensed by peak detector and booster 17 and stored as a reference that may be adjusted up by enough voltage to allow for threshold device 12a variations and timing differences across the array of cells 12.

The peak voltage may be adjusted up by adding to the peak voltage reached on 66' about half of the typical threshold voltage of a memory element 12b or by about 400 mV, as one non-limiting example; the result being VREF. Once the peak detector 17 senses the voltage on node 66' is decreasing due to OTS 12a' thresholding (or triggering as it is sometimes described), the adjusted peak voltage is output as VREF.

The voltage VREF, applied as one input to comparator 42, as shown in FIG. 1, is then compared to the column voltage of the selected column, applied from memory array node 66 as the other input of comparator 42. If the node 66 never reaches VREF, a set bit is detected and the read current is cut off, in one embodiment. Otherwise, if the selected memory array column exceeds VREF, a reset bit is detected. The detected state is provided to the latch 44 and made available as an output.

Generally, the read current is stopped before the minimum combined threshold voltages of the cell 12 in the reset state is exceeded. That combined threshold voltage is about equal to the sum of the threshold voltages of the threshold device 12a and reset memory element 12b, in the case of a reset cell. In the case of reading a reset cell, the select device 12a does not threshold, in some embodiments. Neither of the devices 12a or 12b may switch on at a voltage significantly less than their combined threshold voltages when the selected cell is reset, if their threshold currents, Ith(oum) and Ith(ots), are about the same and not exceeded during the read cycle.

A set cell has a threshold voltage of about 0V, and so the series combination will switch on at a lower voltage than a reset cell, with each case driving the column lower once the select device 12a switches on (for a set bit, the column switches lower upon the column exceeding Vth(ots); and for a reset bit the column switches lower upon the combination of the select device and reset memory cell turning on at about Vth(ots)+Vth(oum) if the threshold currents are about equal). As a result after the node 66' switches lower, the comparator 42 can sense whether the cell has switched on or not by determining whether the cell exceeds VREF within a delay time. If the column reaches the reference voltage VREF, the cell is reset and otherwise the bit set, thus determining the state of the selected cell 12. By similar means, addition VREF may generated to sense additional resistance levels placed in the cell and the resulting column levels relative to VREF.

Thus, in one embodiment, the state of a selected cell 12 is determined without thresholding the cell's select element 12a, the case when the memory element 12b is reset. A read disturb may occur due to the displacement current generated by the thresholding of a reset cell. Since this thresholding of a reset cell may not occur in some embodiments of the present invention, read disturbs may be reduced. The threshold device 12a does threshold when reading a set cell, but the likelihood of a read disturb is reduced when reading the set cell. So long as the capacitive current through the cell is maintained at less than Isafe (about 50% of Ireset) at that reduced pulse width, the low resistance of a set may instead be reinforced instead of degraded during the displacement current of the select element thresholding to a lower voltage. The displacement current may be reduced by reducing the column capacitance (such as with fewer bits per column) and/or increasing the internal cell resistance, such as by increasing the electrode resistance by adjusting resistivity).

Advantageously, reading is done by limiting the voltage applied to the selected cell with a current compliance that is less than a safe current $I_{safe}$ since this current is applied to the set bit for more than a transient time (the displacement current from the select device triggering). The safe current is defined to be less than the current that starts to raise the resistance of any set bit. Raising the resistance of a set bit during reading may result in a read disturb (resetting a set bit). In other words, the voltage forced across the selected cell is kept low enough to avoid a current that would disturb the set cell.

Preferably, the population of bits is scanned at the factory and the reference voltage (VREF) is "programmed" into the chip so the reference voltage is relatively well centered so as to optimize for the variation in bits due to deterioration with use, temperature, and voltage variation in thresholds and holding voltage. Preferably, the reference voltage is adjusted block by block for larger size memories with more than one block on a chip, or even for segments of a block in larger blocks. The reference may be temperature and voltage compensated to better track cell margin.

In a multi-bit scheme for physical cells, multiple reference voltages can be created in a similar fashion. Writing varying resistance levels to a given cell may allow more than one bit per cell using techniques apparent to those skilled in the art, though the techniques described herein are for one bit per cell. For example, VREF1, and an additional VREF2 and VREF3 may be created and appropriately adjusted to allow sensing four different resistance ranges—thus storing two or more logical bits in one physical cell. By such techniques, more or less levels or bits may be stored and sensed in a physical cell, including through use of feedback/rewrite such as with a binary search.

Figures 3A, 3B, 3C:
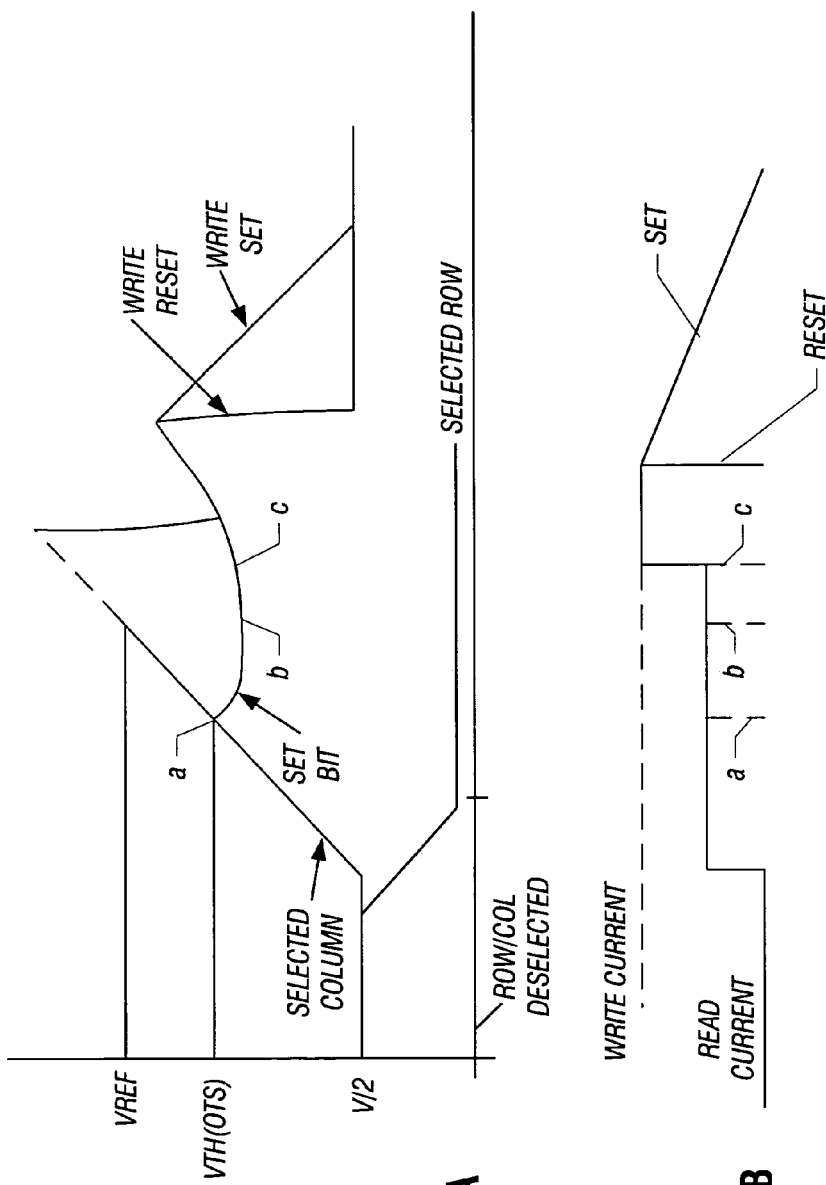
FIG. 3A is a theoretical depiction of voltage versus time for a selected column in accordance with one embodiment of the present invention without using actual data.
FIG. 3B is a theoretical depiction of the read and write current driven into the selected column versus time in accordance with one embodiment of the present invention without using actual data.
FIG. 3C is a theoretical depiction of the read strobe data latch voltage versus time in accordance with three embodiments of the present invention without using actual data.

Referring to FIG. 3A, the column voltage level over time is shown for a selected column and row in accordance with one hypothetical embodiment. In standby or when deselected, the column voltages are approximately equal to V/2, where V is related to the threshold voltages of devices 12a and 12b, and may be adjusted die to die by trimming using techniques familiar to those skilled in the art. Other biasing schemes with better voltage margin but increased standby leakage may be used, such as deselecting the columns to ⅓V and the rows to ⅔V when a block is active (and otherwise putting both to zero volts), or voltages in between these voltages and V/2.

During selection of a cell for read or write, the selected column voltage goes high and the selected row voltage goes low. While deselected, row 16 has an initially higher voltage such as V/2, which falls rapidly, upon selection, to a steady low select voltage which may be near zero depending on row driver sizing and the amount of column current. The deselected column 14 has a relatively lower deselect voltage such as V/2 which may increase as the column is selected. The selected column voltage increases upon selection, as shown in FIG. 3A. FIG. 3B shows how the selected column current steps up for read, forcing the selected column voltage in FIG. 3A to rise after the column current is applied, as shown in FIG. 3B.

The read column current, for example 50 ua, may be greater than the threshold current of the threshold device 12a and a set memory element 12b (which threshold currents may be substantially equal), because, in the embodiment shown in FIG. 3A, the column charging is stopped before the voltage across the memory element 12b exceeds the threshold voltage of a reset memory element 12b.

The selected column voltage rises towards the $V_{TH}$ of the select device 12a. If the memory element is set, the voltage starts dropping at point "a" in FIG. 3A, once the select device 12a thresholds, as indicated for a "set bit" in FIG. 3A. In one embodiment, the set bit may be latched at "a" upon sensing the slower or negative slope of column voltage. The R-strobe signal, for this embodiment, is shown in FIG. 3C at "a." Likewise, the read current may be cut off after the selected set is sensed because the cell's threshold device 12a triggers, in one embodiment, as indicated at "a" in FIG. 3B.

A reset bit exhibits increasing column voltage after the threshold voltage of the threshold element 12a' in FIG. 2 is exceeded. A reset bit may be latched at "b" in FIG. 3C when the column voltage reaches VREF. Then, the column current may be cut off, as indicated at "b" in FIG. 3B, in one embodiment.

In another embodiment, a set bit may be latched (as indicated at "c" in FIG. 3C) when a timeout is exceeded (indicated at "c" in FIG. 3A) without the column exceeding VREF. The read current may be cut off as indicated at "c" in FIG. 3B.

If a read modify write (RMW) operation is desired, the driving of a write current on the column may proceed, as indicated in FIGS. 3A and 3B after completing a read cycle. A reset bit may be written by increasing the current to a "write reset" current level, such as 1 ma, and then after a brief time, such as 10 nsec, abruptly dropping the current after a time interval (fast trailing edge less than 10 nsec) as indicated in FIGS. 3A and 3B. A set bit may be written by using a slowly ramped down current and voltage after an interval (slow trailing edge). Or, a set bit or intermediate resistance or Vth may be written by applying a current less than Ireset but more than Isafe. The intermediate level may be adjusted by making sure the resulting read level is appropriate or readjusting by an additional write cycle.

The timer 49 can be started at the beginning of the cycle when the read fetch cycle is requested and the column starts high. Or, the column can be timed out by a column charge rate sensor. Either way, the set bit changes the column charging rate substantially, signaling to latch the bit as set at "a" in FIG. 3C (to present to the output I/O), or the column reaches VREF, signaling to latch the bit as reset at "b" in FIG. 3C. Thus, the column current may be turned off before the memory element 12b triggers by comparing to VREF and stopping the read current (1) if VREF is reached on the column during read or (2) if a characteristic of a set bit is detected.

VREF is a voltage set low enough to avoid applying more than a threshold voltage across the reset memory element 12b. Stopping the column voltage at or below VREF prevents a reset memory element 12b from thresholding and entering the dV/dI region, which could necessitate refreshing the bit periodically. Such refreshing involves rewriting the bit after reading it, to maintain its higher resistance state. Such refreshing adds to the read cycle time and reduces endurance.

In one embodiment, fixed timing without feedback or sensing the column voltage may be used wherein the column has time to exceed a reference voltage and both are inputs to a comparator, with the output latched after a time delay. If the column slowed down for being set, the column is below the VREF, and otherewise above. Though it is the simplest, this approach may suffer from variations column to column in the bit line capacitance and from bit to bit variations in the threshold of the select device 12a. If the variations are enough, the time delay may be too fast so the column has not yet exceeded $V_{TH}$ (ots), suggesting a misread because the result is not adequately affected by the memory cell resistance state. Or, the time delay may be too slow, allowing the column voltage to exceed both $V_{TH}$ (ots) and $V_{TH}$ (oum) if the bit is reset. Hence, some feedback may be desirable to both sense the cell and prevent the column from exceeding $V_{TH}$ (oum) when the cell is in a reset state.

For better margin, the circuits of FIGS. 4 and 5 may be used which may create a more precise timeout in some embodiments. In FIG. 4, the rate of charging the column line is sensed with a rate detecting comparator SD1 (98A) and SD2 (98B) (not in FIG. 1). The set bit causes the charging rate to change so that the rate change may be detected and a timeout started more precisely to sense that a set bit has not allowed the column to exceed VREF. Alternatively, detecting the rate change may allow latching a one without a timeout for set state, with the cell state latched as set if the rate changes enough. If this has not occurred before a timeout occurs, the bit is reset. Or, if the column first exceeds VREF, the bit is similarly determined to be reset.

As shown in FIG. 5A, the column driven by a selected set bit may cause the rate detector output to fall below 0V, for example, or below some appropriately adjusted reference voltage that is the other input to comparator SD2 98B. If the rate changes enough to fall below the other input to comparator SD1, the threshold device 12a has triggered and the cell state may be determined to be set. Or, a timer can be started to see if the bit falls shortly thereafter below the input to Vd2, set lower and the bit determined to be set or otherwise after a brief time-out the bit may be determined to be reset.

The circuit of FIG. 4 may be used to reduce sensitivity to $V_H$ ots and improve timing accuracy and read speed (compared to a fixed timeout), thus improving read delay and voltage margin during read in some embodiments. Here, the selected read column output C is buffered through an operational amplifier 530 so node D can drive inputs to two comparators SD1 And SD2 through a differentiating series $C_d$ and $R_d$ combination. One skilled in the art will find other alternatives and improvements to sense a change in the rate of charging the column, as are used in rate differentiators.

The sense amplifier and timing circuit 525 may include an operational amplifier 530 which provides an output voltage based on the voltage from the selected line 14c as indicated at C in FIG. 4. The output of the operational amplifier 530 may be fed back to its input as indicated at D in a manner so the output of 530 tracks its input. The output of the operational amplifier is also coupled to a capacitor Cd and a resistor Rd. Together, the capacitor and resistor produce a differentiated output Vd. Thus, the voltage Vd is essentially a rate of change derivative of the charging voltage C from the selected column line 14c.

The sense amplifier and timing circuit 525 may also include a comparator SD1 having a terminal that receives the differentiated column line voltage Vd. The comparator SD1 also receives a voltage Vd1 from an adjustable voltage source, 540. An output terminal of the comparator SD1 provides an output SWC that compares the adjustable voltage Vd1 and the voltage Vd. This signal may then be provided to a timing circuit 545. The timing circuit 545 may be enabled by a read enable signal READ_EN from the comparator SD2 and stopped by a signal SWC or by timing out internally.

The input to comparator SD2 is also coupled to the node Vd. The comparator SD2 is coupled to voltage source 550 which provides an adjustable voltage level Vd2. The comparator SD2 provides an output indicative of a comparison between the voltage Vd and a variable voltage Vd2 from the source 550. Sources 540 and 550 may be on-chip and generated using band-gap techniques to compensate appropriately for temperature and power supply variation using techniques familiar to those reasonably skilled in the art.

The voltage Vd1 of the voltage source 540 may be selected to be lower than a maximum value reached by the derivative voltage Vd. The voltage Vd2 of the voltage source 550 may be selected to be suitably lower than the voltage of the source 540, and may be near zero volts. The output SAout of the comparator SD2 may be coupled to a latch 555 that stores an output signal when enabled by the Read_EN (read) strobe signal from the timing circuit 545 through line SH. The timing circuit 545 provides the strobe signal SH to the latch 555 according to the outputs from the comparators SD1, SD2, and 42. For example, the bit may be reset and 0 may be latched (and read current stopped) if either: the column voltage exceeds VREF, or the output of SD1 switches because the rate of change causes Vd to exceed Vd1 and then fall below it, but Vd does not fall below Vd2 after a brief timeout, such as about 10-20 nsec (so the bit is latched as a reset bit).

The output of SD1 switches high and then low because the rate derivative voltage Vd exceeds Vd1 and then falls below it (which happens for both a set and reset bit). Then SD2 may switch because Vd also falls below Vd2. The bit is latched as a set bit "1" (and read current stopped) if the column does not exceed VREF after a timeout, or if the output of SD2 switches because Vd exceeds Vd1 then falls below Vd2 because of an adequate change in rate slope of column charging (and then discharging) because the bit is set.

Referring to FIG. 5A, during a read operation, a transient column line voltage first increases from the de-selection voltage, time t2, towards a steady state (selected column) Vfinal, depending on the logic value stored in the selected memory element 12b.

At a switching time, t1, the threshold device 12a thresholds (triggers) if the bit is set, rapidly decreasing the voltage across it from $V_{TH}$ (ots) to $V_H$ (ots). Some or all of the voltage is then across the memory element 12b, about Iread×Rset after the transient dies out. In the case where a set bit is stored in the memory element 12b, the line 14c voltage slows substantially or even starts decreasing towards a lower steady state voltage.

In the case where a reset bit is stored, the line voltage, depending on the resistance of the bit and also on the select device 12a's snapback voltage Vsnap, increases towards a value well above the value of a set bit, and may be stopped when the column exceeds VREF. Otherwise, the cell will trigger when Vth(ots)+Vth(oum) is exceeded, or a lesser voltage if Ith(ots) is not about equal to Ith(oum).

The derivative voltage Vd corresponds to the gradient of the line voltage. Accordingly, at the time t2, when reading is initiated, the derivative voltage Vd starts increasing from zero and promptly levels out at a peak voltage until the time t1 when the device 12a triggers.

When the memory element 12b stores a set bit, after t1 the derivative voltage Vd decreases rapidly, and may even become negative. When the selected 12b memory element is set (low resistance), the voltage on the selected column line decreases rapidly approaches a steady state value since the RC is much lower, and so the derivative voltage goes to zero volts as the steady state value is established. Thus, Vd may first exceed Vd1 and Vd2, and then fall below both before stabilizing at 0 volts until the read current is turned off when the read cycle closes.

In the case where the memory element 12b stores a reset bit, after t1 where a set bit would slow or decrease the column, the derivative voltage Vd (reset) does not decrease because the select device does not trigger until the combined Vth of both the select and memory element are exceeded (preferably above VREF).

The derivative voltage Vd first exceeds and then drops below the first voltage Vd1 from the source 540 (FIG. 5A), but only for a set bit. The output from the comparator SD1 is initially at a low value, and switches to a high logic value after the read current is started. Then, comparator SD1 switches to a low logic value when the threshold element 12a has triggered for a set bit.

When the derivative voltage Vd drops below the voltage Vd2 of the voltage source 550, in the case of a set bit, the output signal of the comparator SD2 again switches back to a high logic value. Then, the timing block receives a positive going switching control signal from the comparator SD2. Accordingly, the timing circuit 545 asserts the timing signal SH and enables the latch 555 to store the value of the output signal from the comparator SD2, if now high, as a set bit.

Otherwise, after a predetermined time-out period, (such as 10 nanoseconds) from t2, after the read cycle is started, if the output signal of the comparator SD2 is still at a low logic value, the timing block 545 enables the latch 555 and reset bit is latched. The latched value from the latch 555 corresponds to the logic value stored in the selected memory element 12b, and is entered as a 0 because the bit is not set. Or the column may exceed VREF, which should also trigger latching a zero and closing the read cycle by stopping the column current.

Detecting the switching of the threshold element 12a for a set bit may appropriately limit the read timing, delay, and duration of the read current pulse. Particularly, in some embodiments, the column 14c voltage may be sensed before reaching a steady state, improving speed and allowing use of a current greater than $I_{TH}$ (oum) In some embodiments, using a current pulse having an amplitude substantially equal to or greater than the threshold current of the memory element 12b may improve read delay. In some embodiments, the duration of the pulse can be limited so as to reduce spurious programming of memory elements 12b by avoiding more than $V_{TH}$ being applied across a reset bit.

As shown in FIG. 5A, the column node C of a reset bit goes high until it exceeds VREF (unless stopped sooner by a timeout). Then, the column read current may be turned off and the cycle stopped, resulting in the column voltage staying constant until it is pre-charged to the deselect voltage. For a set bit, node D (FIG. 4) stops or declines depending on the amount of select device snapback voltage and IR (Iread×Rset) drop in the memory element 12b after the device 12a triggers.

Vd(set) for a set bit declines below Vd1 and may decline below Vd2 (or even go negative) and thus trips the comparators SD1 and SD2 after 12a thresholds. This comparator output Vd1 may more optimally be used to start "timeout" the data strobe using timing circuit 545 instead of other timeout approaches or voltage sensing of VREF, and thus start latch 555 as compared to a fixed timeout approach, to detect set. So, data is latched shortly after the column exceeds the threshold device 12a threshold voltage without waiting to see if the VREF is exceeded by the voltage C (or not exceeded). The reference voltage, VREF into comparator 42, if exceeded, signals that the bit being read is reset. The bit is set if the column does not exceed VREF after an appropriate timeout.

The embodiment of FIGS. 4 and 5 may be further enhanced by using a peak detector on the rate detector output voltage Vd. The peak detector allows comparison of the column rate of change relative to a peak rate of change during reading the bit to find how much the column rate of change has decreased relative to peak Vd, as will be apparent to those reasonably skilled in the art.

Figure 6:
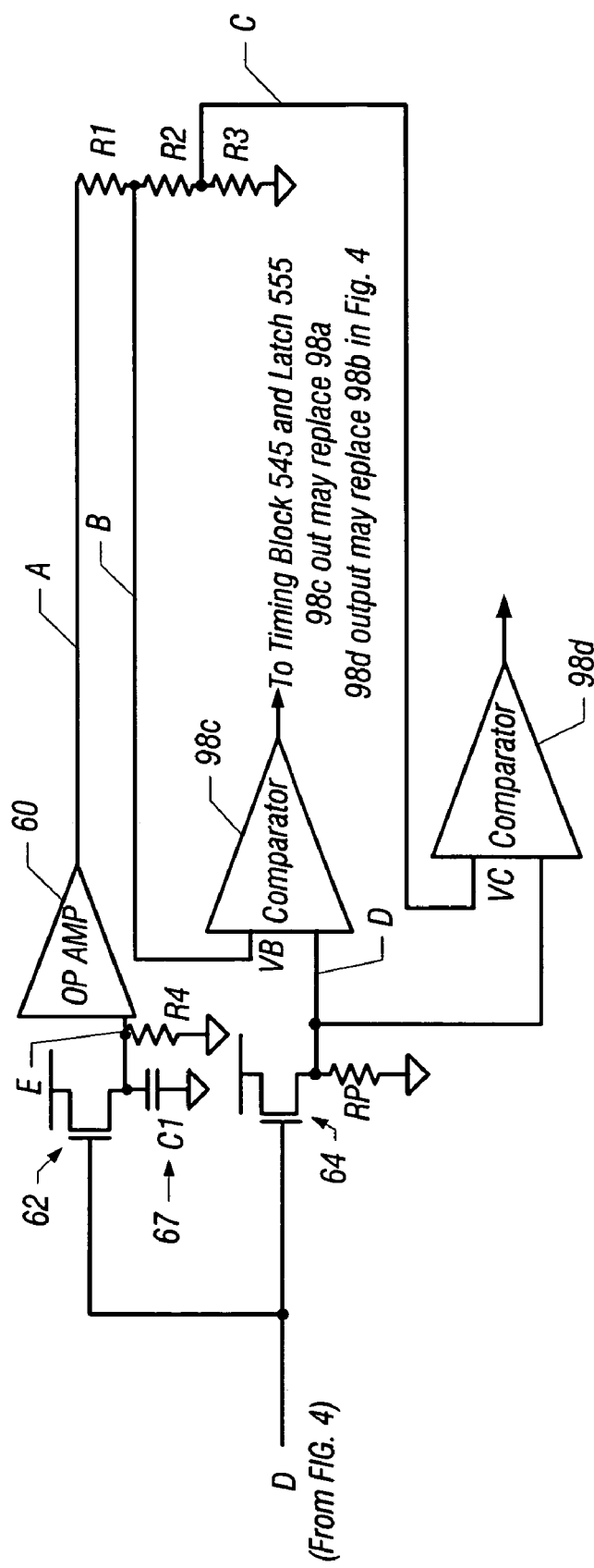
FIG. 6 is a circuit diagram for another embodiment of the present invention in which a peak detector helps set tracking reference inputs to the comparators in FIG. 4.

As a non-limiting example, in FIG. 6 the comparators SD1 and SD2 are replaced, and their inputs instead drive a source follower 64 into the comparators 98c and 98d that sense (follow) the selected column node charging rate, Vd. Also, another source follower 62 creates a similarly translated peak rate of change voltage. This voltage may be buffered through a unity gain operational amplifier 60 and level translated by a resistor or capacitive divider that creates lower voltages B and C. A relatively high value resistor $R_4$ is coupled in parallel with the capacitance $C_1$ to reset the node between read cycles. The resistance may be set to have an R4C1 delay of about 200 nsec.

In FIG. 6, the peak is detected on C1. The voltages D and E are driven by transistors 62 and 64. Additional n-channel transistors (not shown) may be added to drive the source of each of these transistors to ground at the end of the read cycle, to reset the nodes until the next read cycle.

The output of source follower 62 is buffered by an op amp 60, which in turn drives a resistor divider R1, R2, and R3, creating respectively lower voltages B and C. R1, R2, or R3 may be trimmed using, for example, laser fuse repair techniques. Intermediate nodes B and C are dynamically adjusting reference inputs to comparators 98c and 98d that track with the peak of Vd, reflected at E and A. Comparators 98c and 98d perform a similar function as SD1 amd SD2 in FIG. 4. However, the reference DC voltages 540 and 550 in this other embodiment are replaced with dynamically adjusting reference levels B and C respectively. For example, B and C may be instead routed to SD1 and SD2 (instead of Vd1 and Vd2), for the operation in the FIG. 4 embodiment.

As in a comparison to fixed voltages Vd1 and Vd2 in FIG. 4, in the FIG. 6 embodiment, the rate of change is compared to voltages during the read cycle. Initially, the column charges positively at the fastest rate because, until the select device 12a triggers, the resistance of the selected cell is highest and leakage into the cell is minimimum with less voltage across the cell. With highest resistance, most of the read current charges capacitance and establishes the fastest possible rate of change on the column. This peak rate of change is detected, translated, and stored during the rest of the read cycle on the input to op amp 60, node E, and similarly on buffered node A. R4C1 can be driven up in voltage relatively fast. However, R4C1 is large enough compared to the active portion of the read cycle so E decays down slowly, slow enough so that the peak established declines in voltage very little during the rest of the read cycle after the peak is reached.

If the bit is set, D will fall below both voltage B and C after select device 12a triggers because the change in resistance before after device 12a triggers will be greater for a set bit than a reset bit. With more accurate setting of the peak rate of change by sensing and storing it, both levels B and C can be set closer to the peak rate of change and yet assuredly less than the peak rate of change due to the improved accuracy in setting the levels relative to the peak rate. If the rate of change falls below VB, a timer may be more accurately started (relative to a timer begun at the start of the read cycle).

Node D tracks the selected column line up and down, translated for Vgs. Sensing a slow down in the rate of the column charging can be used to timeout the column to latch the data and close the read cycle. For example, if node D input to comparators 98c and 98d first rises above and then falls below both voltages B and C, the bit is set and the cycle may close when the node is below C.

Similarly, after node D exceeds and then falls below B, a timeout may be started. In a short period thereafter, such as 10 nsec, the cycle may close. If the column has not exceed VREF or D falls below Vc, the bit is set. Otherwise, the bit is reset This latter approach helps assure that VREF is not exceeded, and may be even be used by those reasonably skilled in the art to eliminate VREF.

Increased snapback voltage in select device 12a may be preferred relative to the Iread×Rset to cause more change in the column rate of change for a set bit. The threshold voltage of the select element 12a and memory element 12b may be increased to compensate for more variation in Vth(ots) and for more variation in the combined total, Vth(ots)+Vth (oum), such as by increasing the thickness of the device in processing.

Thus, the circuit of FIG. 6 may act as a peak detector to more precisely start the timing for the circuit of FIG. 4. And, the circuit may be used to determine cell state is set. The column voltage does not place more than $V_{TH}$ across the memory sensing material 12b by limiting the column voltage to VREF or with a timeout, such as when it is reset in a higher resistance state.

The peak detector of FIG. 6 may further refine the sensing of the rate change, by sensing a substantial decline from the peak of the rate detector output voltage of op amp 60 by the circuit in FIG. 4. The decline occurs when the select device threshold is exceeded so the select device 12a switches from Vth across it towards a lower voltage $V_H$, or at least the series combination of resistance of devices 12a and 12b declines when 12a thresholds "on."

Any decline is more precisely sensed relative to peak (instead of on an absolute basis affected by variation in $V_H$, dV/dI, etc). If a substantial change in slope does not quickly occur within a time-out after selected column charging starts (t2) or very quickly (such as after a few nanoseconds) after the select device switches (t1), the data may be latched as reset and otherwise as set.

By use of a peak detector, variations in resistance of select device 12a or bit line capacitance may be better accommodated in some embodiments. That is, the rate of initial charging the column is self adjusting bit by bit. Hence, the peak voltage on C1 is sensed and stored for reduction by a voltage divider to create voltages B and C in FIG. 6 that are equivalent in use to 540 and 550 in FIG. 4. Using dynamic voltages may improve margin in sensing when the select device turns on, and thus better assuring detection when the bit is set with the potential for reduced read access delay by not having to time-out to sense a set bit.

To further insure that $V_{TH}$ (oum) is not exceeded through the column voltage charging to an excessively high voltage that may threshold a reset 12b memory, the voltage on the column may be sensed. If a voltage greater than a clamping VREF is reached, the read current may be stopped and the cell state latched as reset. This is an alternate time to strobe the latch instead of only waiting for the timeout when using the embodiments of FIG. 4 and FIG. 6. Also, this can be a further assurance in stopping the cycle if the bit is reset, rather than waiting only for a timeout from start of the read cycle.

In some embodiments, a larger snapback voltage of the phase change memory select element 12a may be utilized without requiring a similar increase in the threshold voltage of the memory element, 12b. Low or no snapback threshold devices may require thinner chalcogenide film thicknesses, specially tailored electrodes, and, perhaps, multiple threshold devices in series for each select device in order to provide an effective holding or threshold voltage of similar value and result in much greater off state leakage than conventional full snapback threshold devices.

In some embodiments, an array of memory elements having select devices whose snapback voltage is greater than or equal to the minimum threshold voltage of the memory element may be utilized. The select device 12b may have a threshold voltage greater than its holding voltage by more than threshold voltage of the memory element, 12a, plus half of the minimum memory element threshold voltage, in some embodiments.

By not thresholding the select device unless the memory element is set, the snapback voltage of the select device can be greater than the threshold voltage of the memory element without risking read disturb of the memory element in the reset state. Not thresholding the select element unless the memory element is set, allows the use of a single, thicker, select ots device to achieve the necessary threshold voltage for the select device.

In one embodiment, the threshold voltage for the select device may be approximately 3 volts. A thicker threshold device, with a larger threshold voltage and larger snapback voltage, may have lower leakage than two select devices in series with the same total threshold voltage.

In some embodiments, a lower select device off-state leakage current is more achievable for a given chalcogenide alloy. Instead of detecting the cell state through finding the difference of two resistance levels in the memory element, the sense amplifier may, instead, distinguish the combined cell threshold voltage difference between the memory cell states. In the embodiments described herein, the difference between the Vth and Vh (Vsnapback) of the select device may exceed the Vth of the memory element without thresholding the memory element when it is reset during read. Allowing larger Vsnapback in the select device may improve the select device off-state leakage of unselected cells in the same array and ease the requirements of the select device characteristics by allowing more snapback voltage and, thus, providing lower leakage when the select device is in deselected and unthreshold state.

In addition, distinguishing the combined cell voltage may ease the requirements of the memory element by allowing its threshold voltage to be less than the snapback voltage of the select device. Also, with the use of full snapback select devices, the bias voltage across unselected bits on the same row or column as the selected bit can be reduced, thereby reducing the off state leakage current, because the write voltages are less so leakage is less when the voltage forced to measure leakage is at a lower percentage of the threshold voltage of the threshold device.

Also, in some embodiments, there is less danger of a read disturb of the reset bit due to snapback of the select device. There may be an increased risk of disturbing the set bit during read, but this may be compensated by appropriate reductions in the column capacitance and/or increased internal resistance in the series combination of the threshold device and memory element.

Reset bits may not be disturbed by the select device snapback, since the select device does not switch on (threshold) when the memory element is reset. Care may be used in the memory element design to ensure that set bits are not disturbed by the threshold device snapback. However, this is easier since more current is required to disturb a set bit and the effect is not cumulative over many read cycles, unless the safe current is exceeded.

In some embodiments, lower demands may be placed on the set-reset resistance window of the memory element due to using voltage detection instead of resistance detection for reading the cell state.

The threshold current of the select device may be engineered to be about equal to the threshold current of the memory element when the select device thresholds, so the select device and memory element both threshold at or near the combined total of the threshold voltages.

The resulting applied voltage across the memory element may be nearly equal to the threshold voltage of the memory element when its select device thresholds when the threshold voltage of the select device is exceeded and the select device thresholds. Similarly, the applied voltage across the select device may be a high percentage of the threshold voltage of the select device when the threshold voltage of the memory element is exceeded and the memory element thresholds (if the reset memory element thresholds before the threshold device, as the column voltage is raised across the cell). Once either the select element or memory element thresholds, the voltage across the thresholded element decreases. Since the voltage on the column cannot change instantaneously, the voltage across the other element increases causing it to also threshold (if not yet thresholded). Accordingly, the threshold current of the threshold device may be adjusted to be approximately equal to the threshold current of the memory element so that both threshold at a high percentage of their threshold voltages respective) (when the memory element is reset).

Figure 7:
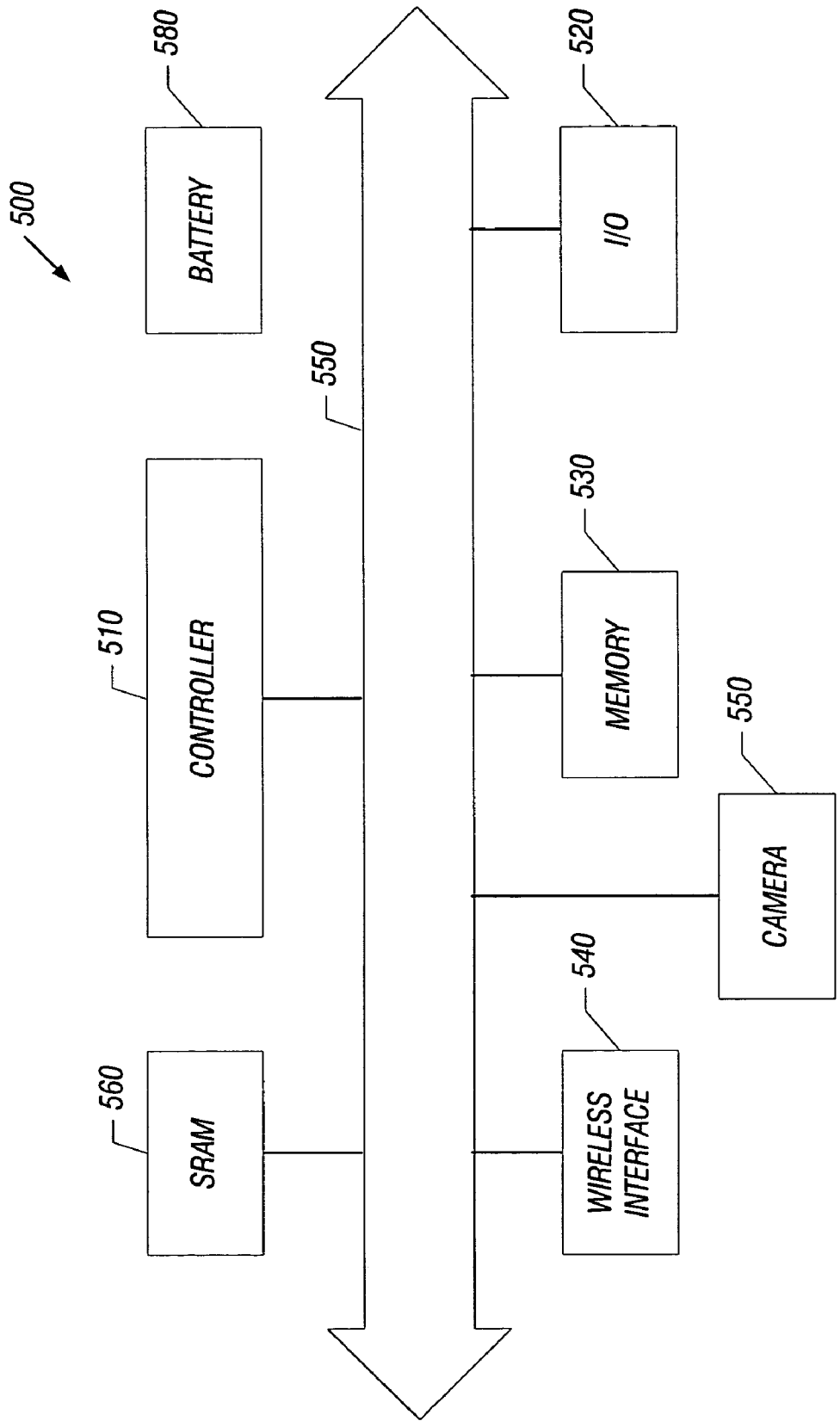
FIG. 7 is a system depiction according to one embodiment of the present invention.

Turning to FIG. 7, a portion of a system 500 in accordance with an embodiment of the present invention is described. System 500 may be used in wireless devices such as, for example, a personal digital assistant (PDA), a laptop or portable computer with wireless capability, a web tablet, a wireless telephone, a pager, an instant messaging device, a digital music player, a digital camera, or other devices that may be adapted to transmit and/or receive information wireessly. System 500 may be used in any of the following systems: a wireless local area network (WLAN) system, a wireless personal area network (WPAN) system, or a cellular network, although the scope of the present invention is not limited in this respect.

System 500 may include a controller 510, an input/output (I/O) device 520 (e.g. a keypad, display), a memory 530, a wireless interface 540, a digital camera 550, and a static random access memory (SRAM) 560 and coupled to each other via a bus 550. A battery 580 may supply power to the system 500 in one embodiment. It should be noted that the scope of the present invention is not limited to embodiments having any or all of these components.

Controller 510 may comprise, for example, one or more microprocessors, digital signal processors, micro-controllers, or the like. Memory 530 may be used to store messages transmitted to or by system 500. Memory 530 may also optionally be used to store instructions that are executed by controller 510 during the operation of system 500, and may be used to store user data. The instructions may be stored as digital information and the user data, as disclosed herein, may be stored in one section of the memory as digital data and in another section as analog memory. As another example, a given section at one time may be labeled as such and store digital information, and then later may be relabeled and reconfigured to store analog information. Memory 530 may be provided by one or more different types of memory. For example, memory 530 may comprise a volatile memory (any type of random access memory), a non-volatile memory such as a flash memory, and/or memory 10 illustrated in FIG. 1, 4 or 6.

The I/O device 520 may be used to generate a message. The system 500 may use the wireless interface 540 to transmit and receive messages to and from a wireless communication network with a radio frequency (RF) signal. Examples of the wireless interface 540 may include an antenna, or a wireless transceiver, such as a dipole antenna, although the scope of the present invention is not limited in this respect. Also, the I/O device 520 may deliver a voltage reflecting what is stored as either a digital output (if digital information was stored), or it may be analog information (if analog information was stored).

While an example in a wireless application is provided above, embodiments of the present invention may also be used in non-wireless applications as well.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
reading a memory cell including a phase change memory element and a chalcogenide select device that does not change phase, by only thresholding said select device when said memory element is set and not thresholding said select device when said memory element is reset.

2. The method of claim 1 including reading said element using a reference level.

3. The method of claim 1 including reducing the read current earlier when a set cell is detected than when detecting a reset cell.

4. The method of claim 1 including reducing the read current before the reset memory element thresholds.

5. The method of claim 2 including sensing whether a level on the selected address line reaches or exceeds the reference level.

6. The method of claim 5 including forming an array of memory elements having select devices with threshold voltages, and using a select device whose snapback voltage is greater than or equal to the minimum threshold voltage of said memory elements.

7. The method of claim 6 including using a select device with a threshold voltage greater than the minimum memory element threshold voltage.

8. The method of claim 6 including determining the rate of change of the selected address line voltage.

9. The method of claim 6 including detecting the peak rate of change of the selected address line voltage.

10. The method of claim 9 including preventing the cell from being exposed to a current sufficient to disturb a set cell.

11. A memory comprising:
an array of phase change memory cells including an address line coupled to said cells and said cells including memory elements coupled to select devices that do not change phase; and
a sense amplifier to sense said addressed line, said sense amplifier to sense said address line without thresholding the select device of a reset cell.

12. The memory of claim 11 wherein said cell includes a nonprogrammable, chalcogenide select device in series with a phase change memory element.

13. The memory of claim 11 including a charging rate detector coupled to said address line.

14. The memory of claim 13 wherein the rate detector starts selected timing.

15. The memory of claim 13 wherein the change in rate is used to determine a memory cell state.

16. The memory of claim 14 wherein a reference generator stores a reference level which is the peak rate of charging said selected address line during reading from said line.

17. The memory of claim 15 wherein said generator outputs the translated reference levels for comparison to the selected address line rate of change.

18. The memory of claim 11 wherein said sense amplifier to sense whether the level on a selected address line reaches or exceeds a reference level.

19. The memory of claim 11 including a reference circuit having a reference select device and current source coupled to said select device.

20. The memory of claim 19 including a peak detector coupled to said reference select device and a booster to form a reference voltage that is higher than the voltage to trigger a set cell but lower than the voltage to trigger a reset cell.

21. A system comprising:
a processor;
a battery coupled to said processor; and
a memory including an array of phase change memory cells having an address line coupled to a cell, said cell including a chalcogenide memory element and a chalcogenide select device that does not change phase, said memory including a circuit to sense the state of said cell when reset without thresholding said select device.

22. The system of claim 21 wherein said cell includes a nonprogrammable, chalcogenide select device coupled in series to a chalcogenide memory element.

23. The system of claim 21 wherein said memory includes a reference circuit coupled to said address line.

24. The system of claim 23 wherein said reference circuit stores a derivative reference peak rate of charging level from said line.

25. The system of claim 24 wherein said reference circuit reduces the level of a signal from said line.

26. The system of claim 23 wherein said reference circuit includes a reference select device.

27. The system of claim 21 including a camera.

28. The system of claim 21 including a camera where information is stored on a memory wherein a cell state is determined by a rate detector.

29. The system of claim 28 including a peak detector.

30. The system of claim 29 including a translated level from a peak detector for comparison to the rate detector output.

* * * * *